US012426421B2

(12) United States Patent
Yang et al.

(10) Patent No.: US 12,426,421 B2
(45) Date of Patent: Sep. 23, 2025

(54) DISPLAY DEVICE INCLUDING SEMICONDUCTOR LIGHT EMITTING DEVICE

(71) Applicant: LG ELECTRONICS INC., Seoul (KR)

(72) Inventors: Dohwan Yang, Seoul (KR); Hongcheol Lee, Seoul (KR); Youngdo Kim, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 517 days.

(21) Appl. No.: 17/971,422

(22) Filed: Oct. 21, 2022

(65) Prior Publication Data

US 2023/0130868 A1    Apr. 27, 2023

(30) Foreign Application Priority Data

Oct. 22, 2021  (WO) ................ PCT/KR2021/014902

(51) Int. Cl.
*H10H 20/857*    (2025.01)
*H01L 25/075*    (2006.01)
*H10H 20/01*    (2025.01)

(52) U.S. Cl.
CPC ....... *H10H 20/857* (2025.01); *H01L 25/0753* (2013.01); *H10H 20/0364* (2025.01)

(58) Field of Classification Search
CPC .. H10H 20/857; H10H 20/0364; H10H 20/01; H10H 20/8506; H01L 25/0753; H01L 2924/12041
See application file for complete search history.

(56) References Cited

U.S. PATENT DOCUMENTS

| 9,825,202 | B2 | 11/2017 | Schuele et al. | |
|---|---|---|---|---|
| 2010/0230711 | A1* | 9/2010 | Kuo | H10H 20/018 257/E33.056 |
| 2013/0285074 | A1* | 10/2013 | Kakowaki | H10H 20/815 438/22 |
| 2014/0084482 | A1* | 3/2014 | Hu | H01L 24/83 257/773 |
| 2016/0181476 | A1* | 6/2016 | Chang | H01L 24/95 257/13 |
| 2017/0179092 | A1* | 6/2017 | Sasaki | H10K 59/70 |
| 2020/0357972 | A1* | 11/2020 | Lutgen | G02B 26/101 |

(Continued)

FOREIGN PATENT DOCUMENTS

| JP | 2017-8380 A | 1/2017 |
|---|---|---|
| KR | 10-2019-0105885 A | 9/2019 |

(Continued)

*Primary Examiner* — Victor A Mandala
(74) *Attorney, Agent, or Firm* — Birch, Stewart, Kolasch & Birch, LLP

(57) ABSTRACT

A display device can include first and second assembly electrodes spaced apart from each other on the substrate, an insulating layer disposed between the first assembly electrode and the second assembly electrode, an assembly barrier wall disposed on the first assembly electrode, the second assembly electrode, the insulating layer and having an assembly hole, an annealed light-transmitting electrode layer disposed on the first assembly electrode and a semiconductor light emitting device disposed in contact with the annealed light-transmitting electrode layer.

20 Claims, 13 Drawing Sheets

(56) References Cited

U.S. PATENT DOCUMENTS

| | | | |
|---|---|---|---|
| 2021/0202800 A1 | 7/2021 | Jung et al. | |
| 2022/0181553 A1* | 6/2022 | Li | H10F 77/247 |
| 2022/0352446 A1 | 11/2022 | Chung et al. | |
| 2023/0215982 A1* | 7/2023 | Song | H01L 25/0753 |
| | | | 257/79 |
| 2023/0395560 A1* | 12/2023 | Chaji | B81B 7/007 |

FOREIGN PATENT DOCUMENTS

| | | |
|---|---|---|
| KR | 10-2019-0126260 A | 11/2019 |
| KR | 10-2020-0011629 A | 2/2020 |
| KR | 10-2020-0026845 A | 3/2020 |
| KR | 10-2020-0030514 A | 3/2020 |

\* cited by examiner

DISPLAY DEVICE INCLUDING SEMICONDUCTOR LIGHT EMITTING DEVICE

CROSS-REFERENCE TO RELATED APPLICATION

Pursuant to 35 U.S.C. § 119(a), this application claims the benefit of an earlier filing date of and the right of priority to PCT Application No. PCT/KR2021/014902, filed on Oct. 22, 2021, the entire contents of which are hereby expressly incorporated by reference into the present application.

BACKGROUND OF THE DISCLOSURE

1. Field of the Disclosure

The embodiment relates to a display device including a semiconductor light emitting device.

2. Discussion of the Related Art

Large-area displays include liquid crystal displays (LCD), OLED displays, and micro-LED displays.

A micro-LED display is a display using a micro-LED, which is a semiconductor light emitting device having a diameter or cross-sectional area of 100 µm or less, as a display device.

Micro-LED display uses micro-LED, which is a semiconductor light emitting device, as a display device. Therefore, Micro-LED display uses micro-LED has excellent performance in many characteristics such as contrast ratio, response speed, color gamut, viewing angle, brightness, resolution, lifespan, luminous efficiency and luminance.

In particular, micro-LED displays have the advantage of being able to separate and combine screens in a modular way, so size or resolution can be freely adjusted and flexible displays can be implemented.

However, since large-sized micro-LED displays require millions of micro-LEDs, there is a technical problem in that it is difficult to quickly and accurately transfer micro-LEDs to a display panel.

Transfer technologies that have been recently developed include a pick and place process, a laser lift-off method, or a self-assembly method.

Among these, the self-assembly method is a method in which the semiconductor light emitting device finds an assembly position in a fluid and is advantageous for realization of a large-screen display device.

Recently, although a micro-LED structure suitable for self-assembly has been proposed in U.S. Pat. No. 9,825,202, etc., research on a technology for manufacturing a display through self-assembly of micro-LED is still insufficient.

In particular, in the case of rapidly transferring millions of semiconductor light emitting devices to a large display in the prior art, although the transfer speed can be improved, there is a technical problem in that the transfer error rate can be increased, so the transfer yield is lowered.

In the related art, a self-assembly method using dielectrophoresis (DEP) has been attempted, but the self-assembly rate is low due to the non-uniformity of the DEP force.

Meanwhile, according to the undisclosed internal technology, self-assembly requires a DEP force, but due to the difficulty of uniform control of the DEP force, there is a problem in that the semiconductor light emitting device is tilted to a different location in the assembly hole during assembly using self-assembly.

In addition, in the subsequent electrical contact process due to the tilting phenomenon of the semiconductor light emitting device, there is a problem in that the electrical contact characteristics are reduced and the lighting rate is lowered.

Therefore, according to the unpublished internal technology, DEP force is required for self-assembly, but when using the DEP force, the semiconductor light emitting device faces a technical contradiction in which electrical contact characteristics are reduced due to the leaning phenomenon.

SUMMARY OF THE DISCLOSURE

One of the technical objects of the embodiment is to solve the problem of low self-assembly rate due to non-uniformity of DEP force in the self-assembly method using dielectrophoresis (DEP).

In addition, one of the technical objects of the embodiment is to solve the problem that the lighting rate is lowered due to the reduction of electrical contact characteristics between the electrodes of the self-assembled light emitting device and a predetermined panel electrode.

The technical objects of the embodiment are not limited to those described in this item, and include those that can be understood throughout the specification.

A display device including a semiconductor light emitting device according to an embodiment can include a substrate, first and second assembly electrodes spaced apart from each other on the substrate, an insulating layer disposed between the first assembly electrode and the second assembly electrode, an assembly barrier wall disposed on the first assembly electrode, the second assembly electrode, the insulating layer and having an assembly hole, an annealed light-transmitting electrode layer disposed on the first assembly electrode and a semiconductor light emitting device disposed in contact with the annealed light-transmitting electrode layer.

A horizontal width of the light-transmitting electrode layer can be greater than or equal to a horizontal width of the semiconductor light emitting device, and can be smaller than a horizontal width of the assembly hole.

The surface of the light-transmitting electrode layer can be treated with O2 plasma or Ar plasma.

The embodiment can further include a conductive bonding layer disposed between the bonding metal of the semiconductor light emitting device and the light-transmitting electrode layer.

The conductive bonding layer of the embodiment can include an intermetallic compound of the bonding metal and the light-transmitting electrode layer material.

The thickness of the conductive bonding layer can be in the range of 1.0~2.0 nm.

The bonding metal can include a protruding bonding portion.

The conductive bonding layer can be disposed between the protruding bonding portion and the light-transmitting electrode layer.

According to the semiconductor light emitting device and the display device including the same according to the embodiment, in the self-assembly method using dielectrophoresis (DEP), there is a technical effect that can solve the problem of low self-assembly rate due to non-uniformity of DEP force.

For example, according to the embodiment, unlike the internal technology, as the light-transmitting dielectric layer 230 is disposed on the first assembly electrode 201 which is an assembly wiring, the electric field is uniformly generated on the first assembly electrode 201 and the second assembly electrode 202, so there is a technical effect that the semiconductor light emitting device 150 can be assembled properly in the assembly hole.

Further, after the semiconductor light emitting device 150 is assembled, an annealing process by a bonding process is performed, the light-transmitting dielectric layer 230 is changed to the light-transmitting electrode 240, so resistance can be significantly lowered and conductivity can be improved, and the light-transmitting dielectric layer 230 can function as a panel electrode.

Accordingly, according to the embodiment, not only the technical effect that the semiconductor light emitting device 150 can be assembled in the assembly hole, but also as the entire area of the bonding metal 155 disposed below the semiconductor light emitting device 150 and the light-transmitting electrode 240 come into contact, the bonding defect is fundamentally eliminated, thereby preventing lighting failure and improving yield.

In addition, according to the embodiment, by disposing the light-transmitting dielectric layer 230 between the bonding metal 155 of the semiconductor light emitting device and the lower assembly electrode to cover the surface morphology of the back bonding metal, the contact characteristics between the back metal of the light emitting device and the panel wiring can be significantly improved, so there is a technical effect to solve the lighting failure.

Further, according to the second embodiment, the conductive bonding layer 190 has a technical effect of improving the electrical conductivity as well as improving the bonding force between the bonding metal 155 and the light-transmitting electrode layer 240.

In addition, according to the third embodiment, not only the bonding strength between the bonding metal 155 and the light-transmitting electrode layer 240 is improved by the second conductive bonding layer 192, but also the electrical conductivity is improved. In addition, since the contact area between the light-transmitting electrode 240 and the bonding metal 155 is secured, there is a complex technical effect of excellent conductivity.

The technical effects of the embodiments are not limited to those described in this item, and include those that can be understood throughout the specification.

BRIEF DESCRIPTION OF THE DRAWINGS

The present invention will become more fully understood from the detailed description given hereinbelow and the accompanying drawings which are given by way of illustration only, and thus are not limitative of the present invention.

DETAILED DESCRIPTION OF THE EMBODIMENTS

Hereinafter, embodiments disclosed in the present description will be described in detail with reference to the accompanying drawings. The suffixes 'module' and 'part' for components used in the following description are given or mixed in consideration of ease of specification, and do not have a meaning or role distinct from each other by themselves. In addition, the accompanying drawings are provided for easy understanding of the embodiments disclosed in the present specification, and the technical ideas disclosed in the present specification are not limited by the accompanying drawings. Further, when an element, such as a layer, region, or substrate, is referred to as being 'on' another component, this includes that it is directly on the other element or there can be other intermediate elements in between.

The display device described in this specification includes a digital TV, a mobile phone, a smart phone, a laptop computer, a digital broadcasting terminal, a personal digital assistant (PDA), a portable multimedia player (PMP), a navigation, a Slate PC, a Tablet PC, an Ultra-Book, a desktop computer, and the like. However, the configuration according to the embodiment described in this specification can be applied to a display capable device even if it is a new product form to be developed later.

Hereinafter, a light emitting device according to an embodiment and a display device including the light emitting device will be described.

Hereinafter, a display device of a semiconductor light emitting device according to an embodiment will be described.

Figure 1:
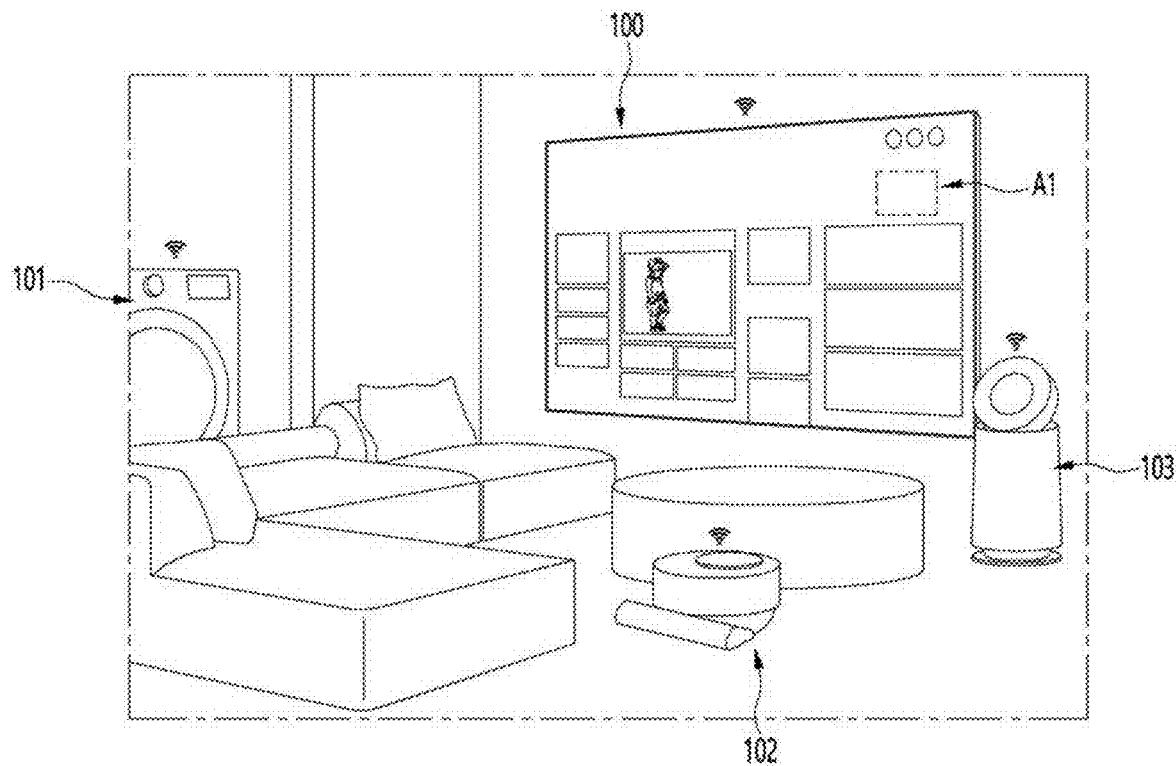
FIG. 1 is an exemplary view of a living room of a house in which a display device according to an embodiment is disposed.

FIG. 1 shows a living room of a house in which a display device 100 according to an embodiment is disposed.

The display device 100 of the embodiment can display the status of various electronic products such as the washing machine 101, the robot cleaner 102, and the air purifier 103, and communicate with each electronic product based on IOT, and can control each electronic product based on the user's setting data.

The display apparatus 100 according to the embodiment can include a flexible display manufactured on a thin and flexible substrate. The flexible display can be bent or rolled like paper while maintaining the characteristics of a conventional flat panel display.

In the flexible display, visual information can be implemented by independently controlling light emission of unit pixels arranged in a matrix form. A unit pixel means a minimum unit for realizing one color. The unit pixel of the flexible display can be implemented by a light emitting device. In an embodiment, the light emitting device can be a Micro-LED or a Nano-LED, but is not limited thereto.

Figure 2:
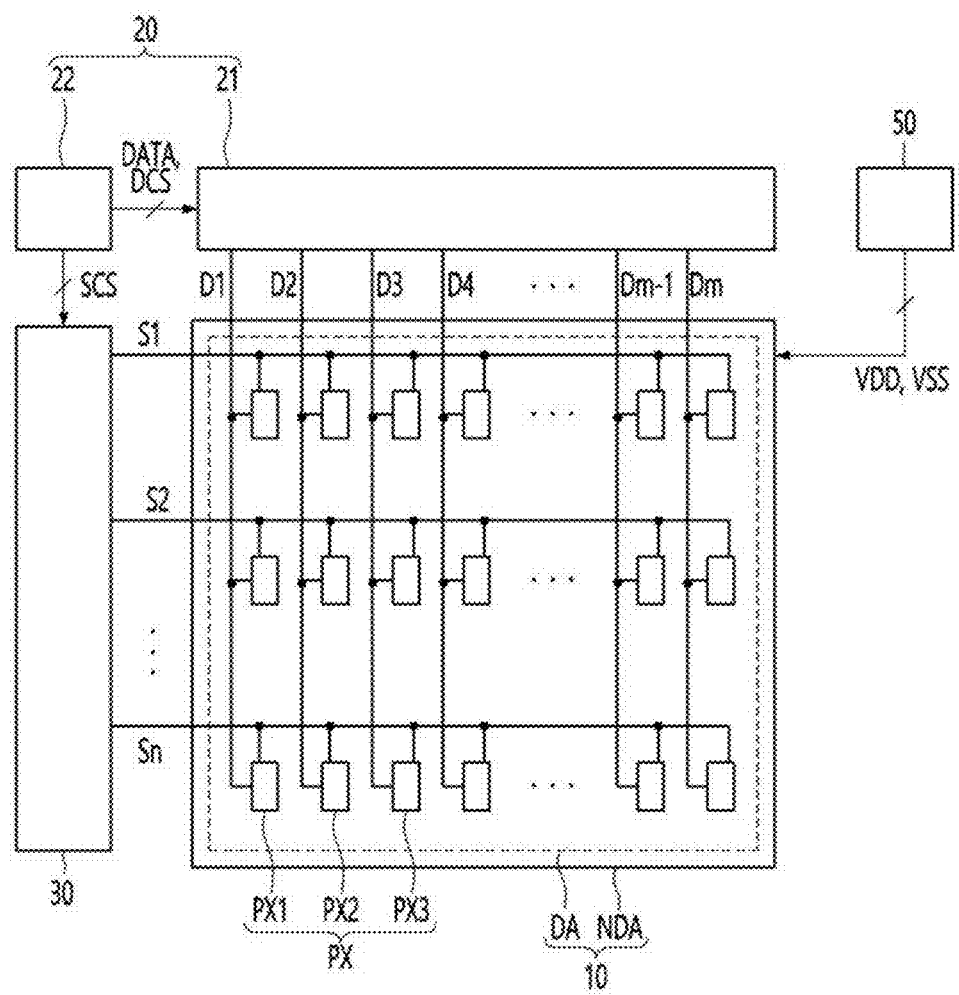
FIG. 2 is a block diagram schematically showing a display device according to an embodiment.
Figure 3:
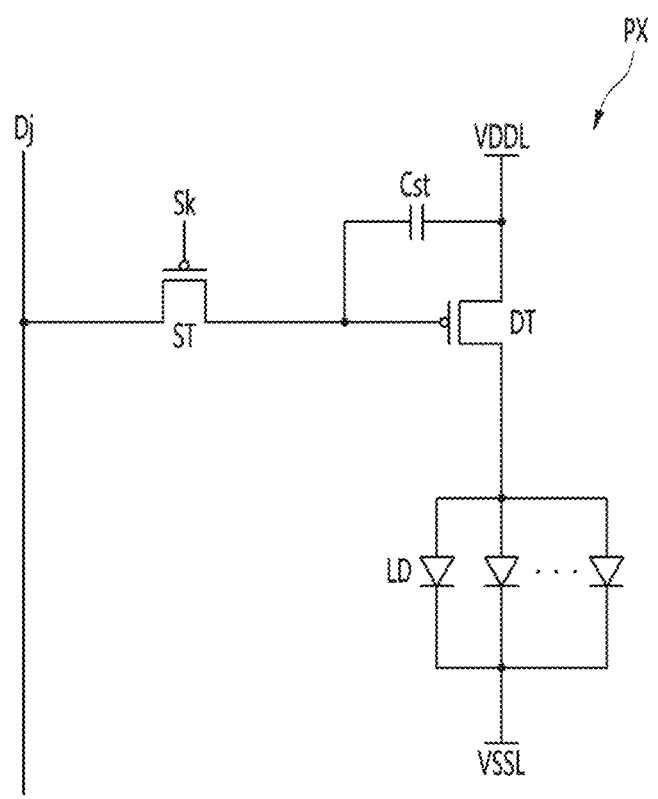
FIG. 3 is a circuit diagram showing an example of the pixel of FIG. 2.

Next, FIG. 2 is a block diagram schematically showing a display device according to an embodiment, and FIG. 3 is a circuit diagram showing an example of the pixel of FIG. 2.

Referring to FIGS. 2 and 3, the display device according to the embodiment can include a display panel 10, a driving circuit 20, a scan driving unit 30, and a power supply circuit 50. All the components of the display device according to all embodiments are operationally coupled and configured.

The display device 100 according to the embodiment can drive the light emitting device using an active matrix (AM) method or a passive matrix (PM, passive matrix) method.

The driving circuit 20 can include a data driving unit 21 and a timing control unit 22.

The display panel 10 can be divided into a display area DA and a non-display area NDA disposed around the display area DA. The display area DA is an area in which pixels PX are formed to display an image. The display panel 10 includes data lines (D1 to Dm, m is an integer greater than or equal to 2), scan lines crossing the data lines D1 to Dm (S1 to Sn, n is an integer greater than or equal to 2), the high-potential voltage line supplied with the high-voltage, the low-potential voltage line supplied with the low-potential voltage, and the pixels PX connected to the data lines D1 to Dm and the scan lines S1 to Sn can be included.

Each of the pixels PX can include a first sub-pixel PX1, a second sub-pixel PX2, and a third sub-pixel PX3. The first sub-pixel PX1 emits a first color light of a first wavelength, the second sub-pixel PX2 emits a second color light of a second wavelength, and the third sub-pixel PX3 emits a third color light of a wavelength can be emitted. The first color light can be red light, the second color light can be green light, and the third color light can be blue light, but is not limited thereto. Further, although it is illustrated that each of the pixels PX includes three sub-pixels in FIG. 2, the present invention is not limited thereto. For example, each of the pixels PX can include four or more sub-pixels.

Each of the first sub-pixel PX1, the second sub-pixel PX2, and the third sub-pixel PX3 can connected to at least one of the data lines D1 to Dm, and at least one of the scan lines S1 to Sn, and a high potential voltage line. As shown in FIG. 3, the first sub-pixel PX1 can include the light emitting devices LD, plurality of transistors for supplying current to the light emitting devices LD, and at least one capacitor Cst.

Each of the first sub-pixel PX1, the second sub-pixel PX2, and the third sub-pixel PX3 can include only one light emitting device LD and at least one capacitor Cst.

Each of the light emitting devices LD can be a semiconductor light emitting diode including a first electrode, a plurality of conductivity type semiconductor layers, and a second electrode. Here, the first electrode can be an anode electrode and the second electrode can be a cathode electrode, but the present invention is not limited thereto.

Referring to FIG. 3, the plurality of transistors can include a driving transistor DT for supplying current to the light emitting devices LD, and a scan transistor ST for supplying a data voltage to the gate electrode of the driving transistor DT. The driving transistor DT can include a gate electrode connected to the source electrode of the scan transistor ST, a source electrode connected to a high potential voltage line to which a high potential voltage is applied, and a drain electrode connected to first electrodes of the light emitting devices LD. The scan transistor ST can include a gate electrode connected to the scan line Sk, where k is an integer satisfying 1≤k≤n, a source electrode connected to the gate electrode of the driving transistor DT, and a drain electrode connected to data lines Dj, where j is integer satisfying 1≤j≤m.

The capacitor Cst is formed between the gate electrode and the source electrode of the driving transistor DT. The storage capacitor Cst can charge a difference between the gate voltage and the source voltage of the driving transistor DT.

The driving transistor DT and the scan transistor ST can be formed of a thin film transistor. In addition, although the driving transistor DT and the scan transistor ST have been mainly described in FIG. 3 as being formed of a P-type MOSFET (Metal Oxide Semiconductor Field Effect Transistor), the present invention is not limited thereto. The driving transistor DT and the scan transistor ST can be formed of an N-type MOSFET. In this case, the positions of the source electrode and the drain electrode of each of the driving transistor DT and the scan transistor ST can be changed.

Further, in FIG. 3 has been illustrated each of the first sub-pixel PX1, the second sub-pixel PX2, and the third sub-pixel PX3 includes one driving transistor DT, one scan transistor ST, and 2T1C (2 Transistor-1 capacitor) having a capacitor Cst, but the present invention is not limited thereto. Each of the first sub-pixel PX1, the second sub-pixel PX2, and the third sub-pixel PX3 can include a plurality of scan transistors ST and a plurality of capacitors Cst.

Referring back to FIG. 2, the driving circuit 20 outputs signals and voltages for driving the display panel 10. To this end, the driving circuit 20 can include a data driver 21 and a timing controller 22.

The data driver 21 receives digital video data DATA and a source control signal DCS from the timing controller 22. The data driver 21 converts the digital video data DATA into analog data voltages according to the source control signal DCS and supplies them to the data lines D1 to Dm of the display panel 10.

The timing controller 22 receives digital video data DATA and timing signals from the host system. The timing signals can include a vertical sync signal, a horizontal sync signal, a data enable signal, and a dot clock. The host system can be an application processor of a smartphone or tablet PC, a monitor, or a system-on-chip of a TV.

The scan driver 30 receives the scan control signal SCS from the timing controller 22. The scan driver 30 generates scan signals according to the scan control signal SCS and supplies them to the scan lines S1 to Sn of the display panel 10. The scan driver 30 can include a plurality of transistors and can be formed in the non-display area NDA of the display panel 10. Further, the scan driver 30 can be formed of an integrated circuit, and in this case, can be mounted on a gate flexible film attached to the other side of the display panel 10.

The power supply circuit 50 generates a high potential voltage VDD and a low potential voltage VSS for driving the light emitting devices LD of the display panel 10 from the main power source, and the power supply circuit can supply VDD and VSS to the high-potential voltage line and the low-potential voltage line of the display panel 10. Further, the power supply circuit 50 can generate and supply driving voltages for driving the driving circuit 20 and the scan driving unit 30 from the main power.

Figure 4:
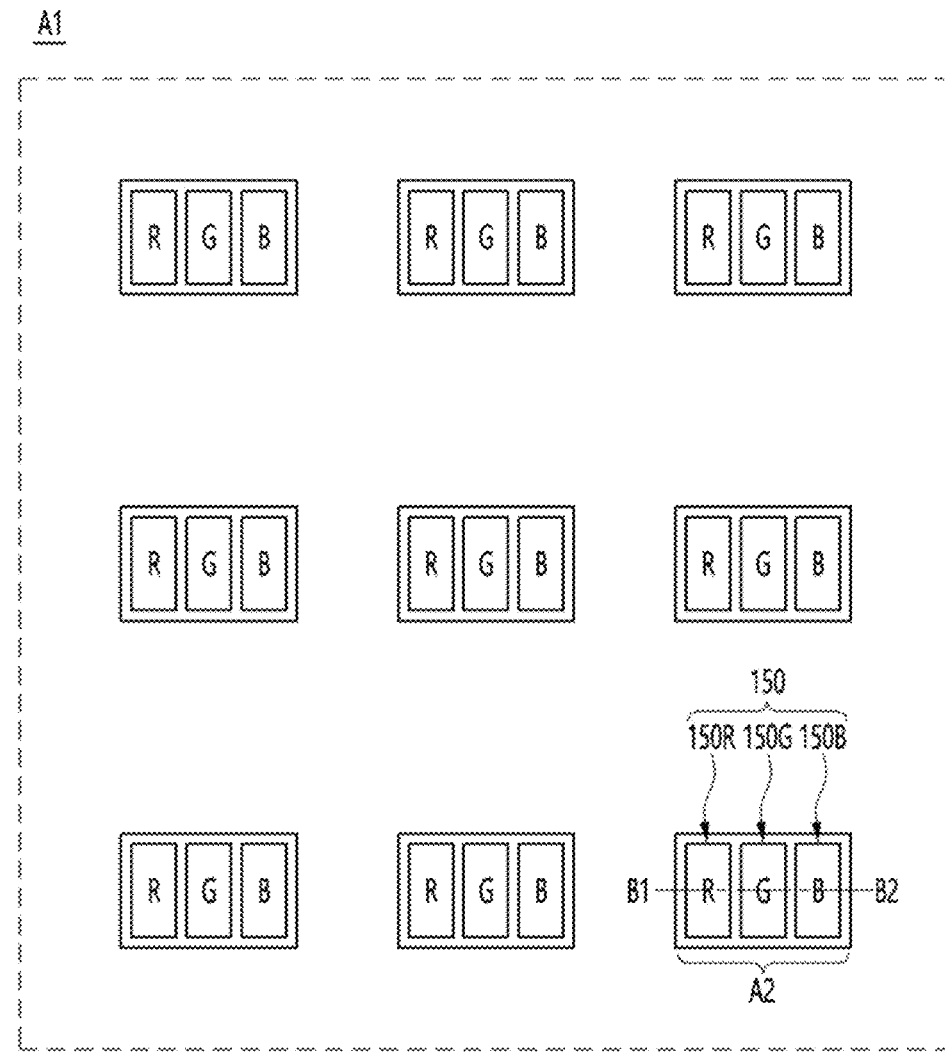
FIG. 4 is an enlarged view of a first panel area in the display device of FIG. 1.

Next, FIG. 4 is an enlarged view of the first panel area A1 in the display device of FIG. 1.

Referring to FIG. 4, the display device 100 according to the embodiment can be manufactured by mechanically and electrically connecting a plurality of panel areas such as the first panel area A1 by tiling.

The first panel area A1 can include a plurality of light emitting devices 150 arranged for each unit pixel (PX in FIG. 2).

For example, the unit pixel PX can include a first sub-pixel PX1, a second sub-pixel PX2, and a third sub-pixel PX3. For example, a plurality of red light-emitting devices 150R are disposed in the first sub-pixel PX1, a plurality of green light-emitting devices 150G are disposed in the second sub-pixel PX2, and a plurality of blue light-emitting devices 150B are disposed in the third sub-pixel PX3. The unit pixel PX can further include a fourth sub-pixel in which a light emitting device is not disposed, but is not limited thereto. Meanwhile, the light emitting device 150 can be the semiconductor light emitting device.

Figure 5:
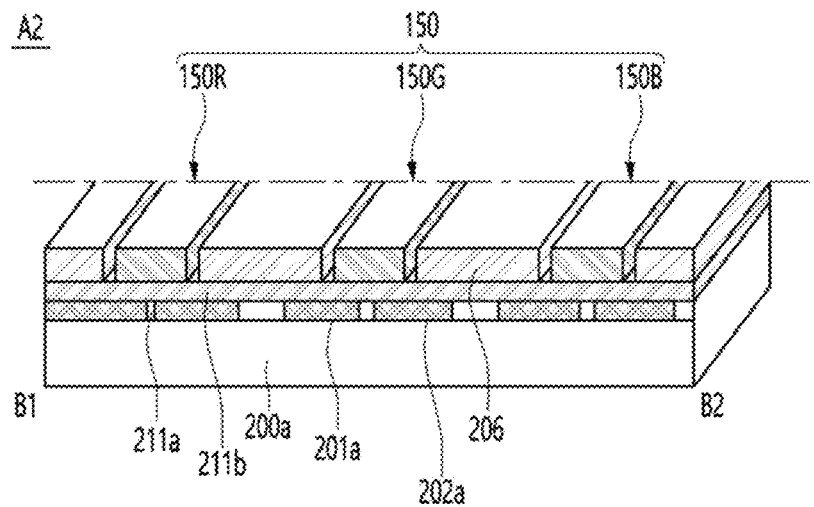
FIG. 5 is a cross-sectional view taken along line B1-B2 of area A2 of FIG. 4.

Next, FIG. 5 is a cross-sectional view taken along line B1-B2 of area A2 of FIG. 4.

Referring to FIG. 5, the display device 100 of the embodiment includes a substrate 200a, wirings 201a and 202a spaced apart from each other, a first insulating layer 211a, a second insulating layer 211b, a third insulating layer 206 and a plurality of light emitting devices 150.

The wiring can include a first wiring 201a and a second wiring 202a spaced apart from each other. The first wiring 201a and the second wiring 202a can function as panel wiring for applying power to the light emitting device 150 in the panel, and in the case of self-assembly of the light emitting device 150, Further, the first wiring 201a and the second wiring 202a can function as an assembly electrode for generating a dielectrophoresis force.

The wirings 201a and 202a can be formed of a transparent electrode (ITO) or include a metal material having excellent electrical conductivity. For example, the wirings 201a and 202a can be formed at least one of titanium (Ti), chromium (Cr), nickel (Ni), aluminum (Al), platinum (Pt), gold (Au), tungsten (W), molybdenum (Mo) or an alloy thereof.

A first insulating layer 211a can be disposed between the first wiring 201a and the second wiring 202a, and a second insulating layer 211b can be disposed on the first wiring 201a and the second wiring 202a. The first insulating layer 211a and the second insulating layer 211b can be an oxide film, a nitride film, or the like, but are not limited thereto.

The light emitting device 150 can include a red-light emitting device 150R, a green light emitting device 150G, and a blue light emitting device 150B0 to form a sub-pixel, respectively, but is not limited thereto. The light emitting device 150 can include a red phosphor and a green phosphor to implement red and green, respectively The substrate 200a can be formed of glass or polyimide. Further, the substrate 200a can include a flexible material such as polyethylene naphthalate (PEN) or polyethylene terephthalate (PET). In addition, the substrate 200 can include a transparent material, but is not limited thereto. The substrate 200a can function as a support substrate in the panel, and can function as a substrate for assembly when self-assembling the light emitting device.

The third insulating layer 206 can include an insulating and flexible material such as polyimide, PEN, or PET, and can be integrally formed with the substrate 200a to form one substrate.

The third insulating layer 206 can be a conductive adhesive layer having adhesiveness and conductivity, and the conductive adhesive layer can be flexible to enable a flexible function of the display device. For example, the third insulating layer 206 can be an anisotropy conductive film (ACF) or a conductive adhesive layer such as an anisotropic conductive medium or a solution containing conductive particles. The conductive adhesive layer can be a layer that is electrically conductive in a direction perpendicular to the thickness but electrically insulating in a direction horizontal to the thickness.

The distance between the first and second wirings 201a and 202a is formed to be smaller than the width of the light emitting device 150 and the width of the assembly hole 203H, so the assembly position of the light emitting device 150 using an electric field can be more precisely fixed.

A third insulating layer 206 is formed on the first and second wirings 201a and 202a to protect the first and second wirings 201a and 202a from the fluid 1200, and the third insulating layer 206 is can prevent leakage of current flowing through the two wirings 201a and 202a. The third insulating layer 206 can be formed of a single layer or multiple layers of an inorganic insulator such as silica or alumina or an organic insulator.

In addition, the third insulating layer 206 can include an insulating and flexible material such as polyimide, PEN, PET, etc., and can be formed integrally with the substrate 200 to form a single substrate.

The third insulating layer 206 has a barrier wall, and an assembly hole 203H can be formed by the barrier wall. For example, the third insulating layer 206 can include an assembly hole 203H through which the light emitting device 150 is inserted (refer to FIG. 6). Accordingly, during self-assembly, the light emitting device 150 can be easily inserted into the assembly hole 203H of the third insulating layer 206. The assembly hole 203H can be referred to as an insertion hole, a fixing hole, or an alignment hole.

The assembly hole 203H can have a shape and a size corresponding to the shape of the light emitting device 150 to be assembled at a corresponding position. Accordingly, it is possible to prevent other light emitting devices from being assembled in the assembly hole 203H or from assembling a plurality of light emitting devices.

Figure 6:
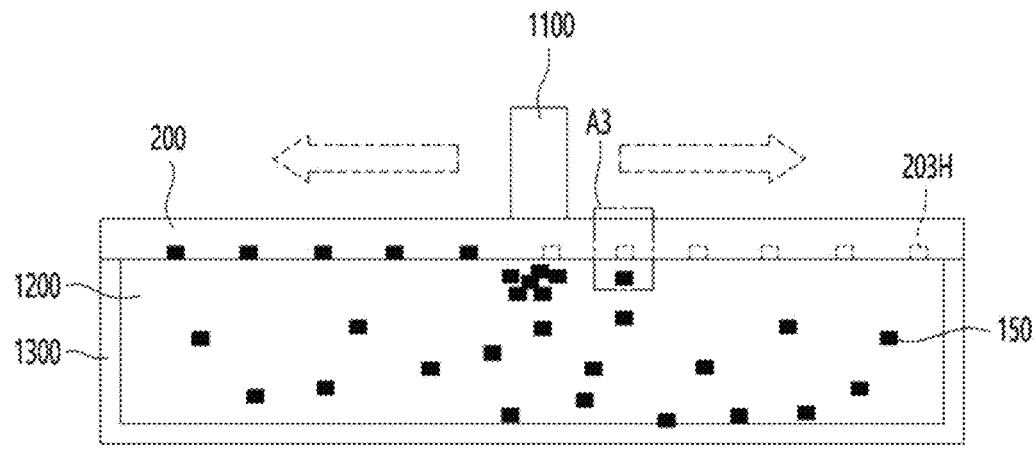
FIG. 6 is an exemplary view in which the light emitting device according to the embodiment is assembled on a substrate by a self-assembly method.
Figure 7:
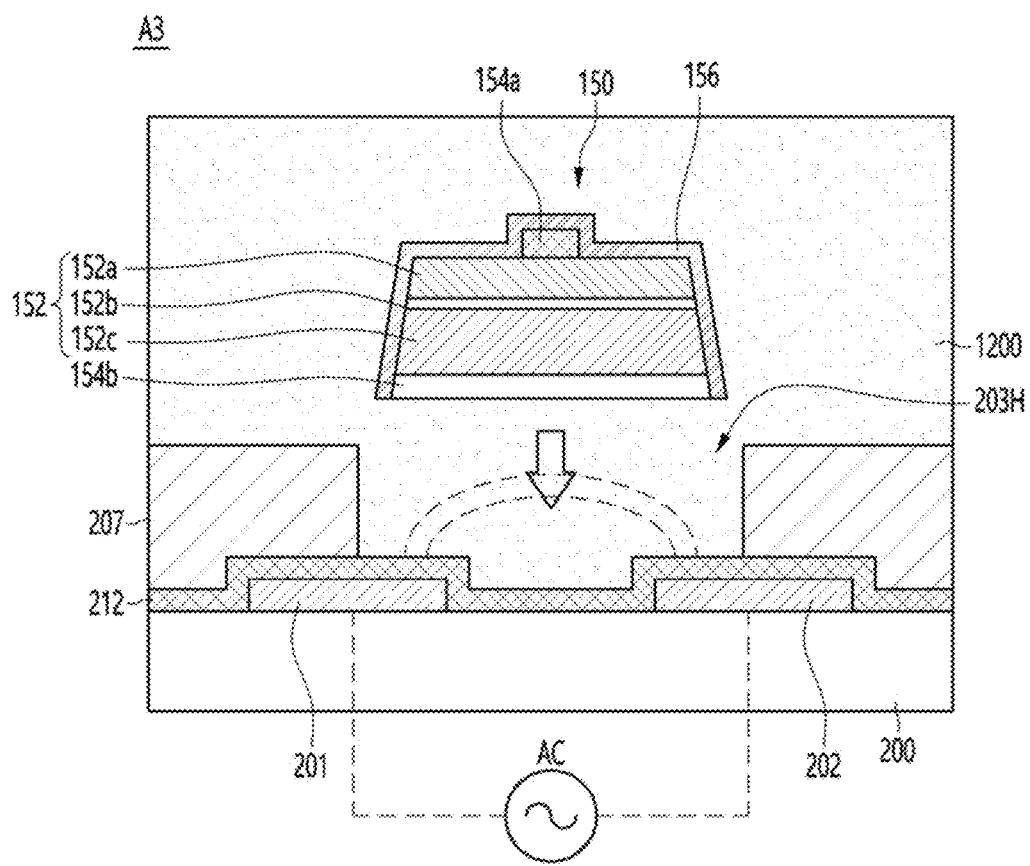
FIG. 7 is a partially enlarged view of area A3 of FIG. 6.

Next, FIG. 6 is a view showing an example in which the light emitting device according to the embodiment is assembled on a substrate by a self-assembly method, and FIG. 7 is a partially enlarged view of area A3 of FIG. 6. FIG. 7 is a diagram illustrating a state in which area A3 is rotated 180 degrees for convenience of explanation.

An example in which the semiconductor light emitting device according to the embodiment is assembled in a display panel by a self-assembly method using an electromagnetic field will be described with reference to FIGS. 6 and 7.

The assembly substrate 200 to be described later can also function as the panel substrate 200a in the display device after assembly of the light emitting device, but the embodiment is not limited thereto.

Referring to FIG. 6, the semiconductor light emitting device 150 can be put into the chamber 1300 filled with the fluid 1200, and the semiconductor light emitting device 150 by the magnetic field generated from the assembly device 1100 can move to the assembly substrate 200. In this case, the light emitting device 150 adjacent to the assembly hole 203H of the assembly substrate 200 can be assembled in the assembly hole 203H by a dielectrophoretic force by an electric field of the assembly electrodes. The fluid 1200 can be water such as ultrapure water, but is not limited thereto. A chamber can be referred to as a water bath, container, vessel, or the like.

After the semiconductor light emitting device 150 is put into the chamber 1300, the assembly substrate 200 can be disposed on the chamber 1300. According to an embodiment, the assembly substrate 200 can be introduced into the chamber 1300.

Referring to FIG. 7, the semiconductor light emitting device 150 can be implemented as a vertical semiconductor light emitting device as shown, but is not limited thereto, and a horizontal light emitting device can be employed.

The semiconductor light emitting device 150 can include a magnetic layer having a magnetic material. The magnetic layer can include a magnetic metal such as nickel (Ni). Since the semiconductor light emitting device 150 injected into the fluid includes a magnetic layer, it can move to the assembly substrate 200 by the magnetic field generated from the assembly device1100. The magnetic layer can be disposed above or below or on both sides of the light emitting device.

The semiconductor light emitting device 150 can include a passivation layer 156 surrounding the top and side surfaces. The passivation layer 156 can be formed by using an inorganic insulator such as silica or alumina through PECVD, LPCVD, sputtering deposition, or the like. In addition, the passivation layer 156 can be formed through a method of spin coating an organic material such as a photoresist or a polymer material.

The semiconductor light emitting device 150 can include a diode stack 152 of a first conductivity type semiconductor layer 152a, a second conductivity type semiconductor layer 152c, and an active layer 152b disposed between the first conductivity type semiconductor layer 152a and the second conductivity type semiconductor layer 152c. The first conductivity type semiconductor layer 152a can be an n-type semiconductor layer, and the second conductivity type semiconductor layer 152c can be a p-type semiconductor layer, but is not limited thereto.

A first electrode layer 154a can be disposed on the first conductivity type semiconductor layer 152a, and a second electrode layer 154b can be disposed on the second conductivity type semiconductor layer 152c. To this end, a partial region of the first conductivity type semiconductor layer 152a or the second conductivity type semiconductor layer 152c can be exposed to the outside. Accordingly, after the semiconductor light emitting device 150 is assembled on the assembly substrate 200, a portion of the passivation layer 156 can be etched in the manufacturing process of the display device.

The assembly substrate 200 can include a pair of first assembly electrodes 201 and second assembly electrodes 202 corresponding to each of the semiconductor light emitting devices 150 to be assembled. The first assembly electrode 201 and the second assembly electrode 202 can be formed by stacking a single metal, a metal alloy, or a metal oxide in multiple layers. For example, the first assembly electrode 201 and the second assembly electrode 202 can be formed including at least one of Cu, Ag, Ni, Cr, Ti, Al, Rh, Pd, Ir, Ru, Mg, Zn, Pt, Au, or Hf, but is not limited thereto. In addition, the first assembly electrode 201 and the second assembly electrode 202 can be formed including at least one of indium tin oxide (ITO), indium zinc oxide (IZO), indium zinc tin oxide (IZTO), indium aluminum zinc oxide (IAZO), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, or Ni/IrOx/Au/ITO, and is not limited thereto.

The first assembly electrode 201, the second assembly electrode 202 emits an electric field as an AC voltage is applied, the semiconductor light emitting device 150 inserted into the assembly hole 203H can be fixed by dielectrophoretic force. A distance between the first assembly electrode 201 and the second assembly electrode 202 can be smaller than a width of the semiconductor light emitting device 150 and a width of the assembly hole 203H, the assembly position of the semiconductor light emitting device 150 using the electric field can be more precisely fixed.

An insulating layer 212 is formed on the first assembly electrode 201 and the second assembly electrode 202 to protect the first assembly electrode 201 and the second assembly electrode 202 from the fluid 1200 and leakage of current flowing through the first assembly electrode 201 and the second assembly electrode 202 can be prevented. For example, the insulating layer 212 can be formed of a single layer or multiple layers of an inorganic insulator such as silica or alumina or an organic insulator. The insulating layer 212 can have a minimum thickness to prevent damage to the first assembly electrode 201 and the second assembly electrode 202 when the semiconductor light emitting device 150 is assembled, and it can have a maximum thickness for the semiconductor light emitting device 150 being stably assembled.

A barrier wall 207 can be formed on the insulating layer 212. A portion of the barrier wall 207 can be positioned on the first assembly electrode 201 and the second assembly electrode 202, and the remaining region can be positioned on the assembly substrate 200.

On the other hand, when the assembly substrate 200 is manufactured, a portion of the barrier walls formed on the entire upper portion of the insulating layer 212 is removed, an assembly hole 203H in which each of the semiconductor light emitting devices 150 is coupled and assembled to the assembly substrate 200 can be formed.

An assembly hole 203H to which the semiconductor light emitting devices 150 are coupled is formed in the assembly substrate 200, and a surface on which the assembly hole 203H is formed can be in contact with the fluid 1200. The assembly hole 203H can guide an accurate assembly position of the semiconductor light emitting device 150.

Meanwhile, the assembly hole 203H can have a shape and a size corresponding to the shape of the semiconductor light emitting device 150 to be assembled at a corresponding position. Accordingly, it is possible to prevent assembling other semiconductor light emitting devices or assembling a plurality of semiconductor light emitting devices in the assembly hole 203H.

Referring back to FIG. 6, after the assembly substrate 200 is disposed in the chamber, the assembly device1100 for applying a magnetic field can move along the assembly substrate 200. The assembly device 1100 can be a permanent magnet or an electromagnet.

The assembly device1100 can move while in contact with the assembly substrate 200 in order to maximize the area applied by the magnetic field into the fluid 1200. According to an embodiment, the assembly device 1100 can include a plurality of magnetic materials or a magnetic material having a size corresponding to that of the assembly substrate 200. In this case, the moving distance of the assembly device 1100 can be limited within a predetermined range.

The semiconductor light emitting device 150 in the chamber 1300 can move toward the assembly device 1100 and the assembly substrate 200 by the magnetic field generated by the assembly device 1100.

Referring to FIG. 7, the semiconductor light emitting device 150 is moving toward the assembly device 1100, it can enter and be fixed into the assembly hole 203H by a dielectrophoretic force (DEP force) formed by the electric field of the assembly electrode of the assembly substrate.

Specifically, the first and second assembly wirings 201 and 202 can form an electric field by an AC power source, and a dielectrophoretic force can be formed between the assembly wirings 201 and 202 by this electric field. The semiconductor light emitting device 150 can be fixed to the assembly hole 203H on the assembly substrate 200 by this dielectrophoretic force.

At this time, a predetermined solder layer is formed between the light emitting device 150 and the assembly electrode assembled on the assembly hole 203H of the assembly substrate 200 to can improve the bonding force of the light emitting device 150.

In addition, a molding layer can be formed in the assembly hole 203H of the assembly substrate 200 after assembly. The molding layer can be a transparent resin or a resin including a reflective material and a scattering material.

By the self-assembly method using the electromagnetic field described above, the time required for each of the semiconductor light emitting devices to be assembled on the substrate can be rapidly reduced, so a large-area high-pixel display can be implemented more quickly and economically.

Figure 8A:
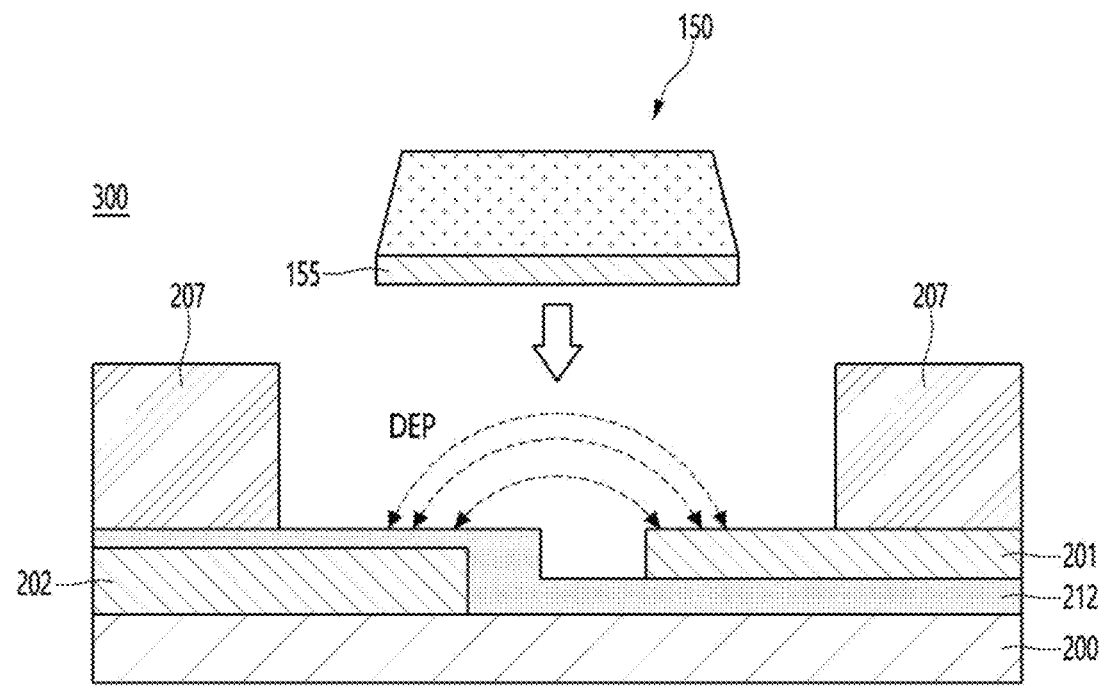
FIGS. 8A to 8B is an example of self-assembly in the display device 300 according to the internal technology.
Figure 8B:
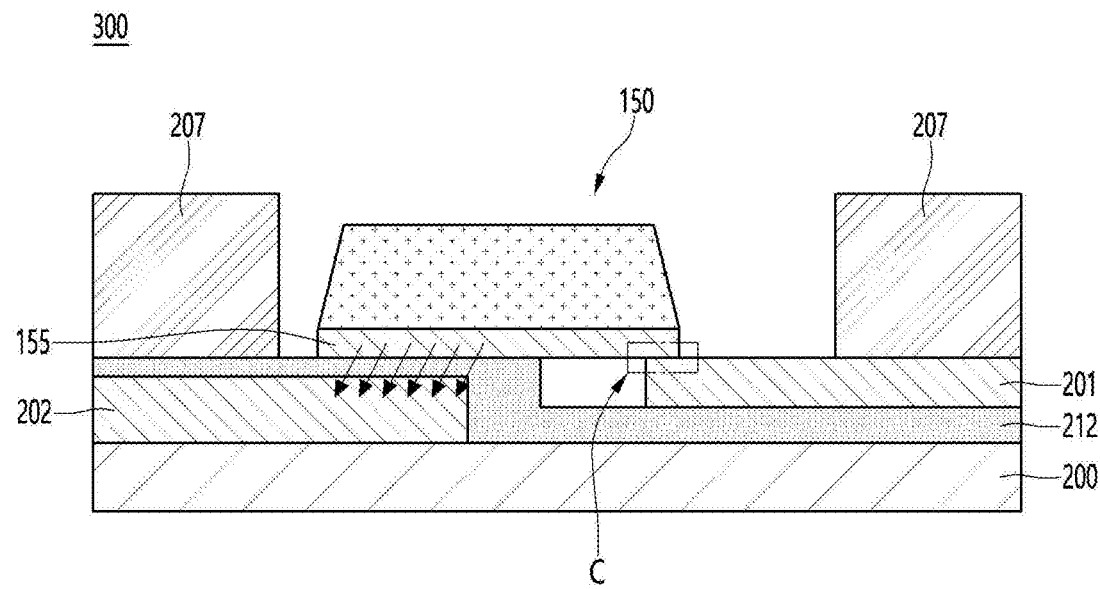
Figure 8C:
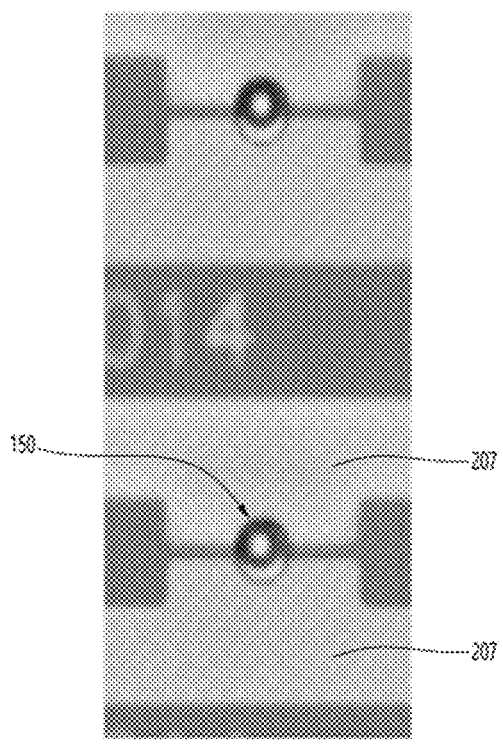
FIG. 8C is a self-assembly picture in the display device according to the internal technology.

Next, FIGS. 8A to 8B are diagrams illustrating self-assembly in the display device 300 according to the internal technology, and FIG. 8C is a picture of self-assembly in the display device according to the internal technology.

In the display device 300 according to the internal technology, either the first assembly electrode 201 or the second assembly electrode 202 is brought into contact with the bonding metal 155 of the semiconductor light emitting device 150 through a bonding process.

However, in order to solve the problem that the bonding area is also reduced as the semiconductor light emitting device 150 is miniaturized, as shown in FIGS. 8A to 8B, a method of omitting the existing Vdd line and completely opening its role to one side of the electrode wiring is used.

However, when this method is used, the semiconductor light emitting device 150 drawn to the first assembly electrode 201 by DEP in the fluid comes into contact with the first assembly electrode 201 and becomes conductive. Accordingly, the electric field force is concentrated on the second assembly electrode 202 that is not opened by the insulating layer 212, and as a result, there is a problem in that the assembly is biased in one direction.

Referring to FIGS. 8B and 8C, the contact area C between the bonding metal 155 of the semiconductor light emitting device 150 and the first assembly electrode 201 functioning as a panel electrode is very small, so poor contact can occur.

For example, according to the undisclosed internal technology, even-though DEP Force is required for self-assembly, due to the difficulty of uniform control of the DEP force, there is a problem in that the semiconductor light emitting device tilts to a different place in the assembly hole during assembly using self-assembly.

In addition, due to this tilt phenomenon of the semiconductor light emitting device, electrical contact characteristics are lowered in the subsequent electrical contact process, resulting in a defective lighting rate and a lower yield.

Figure 8D:
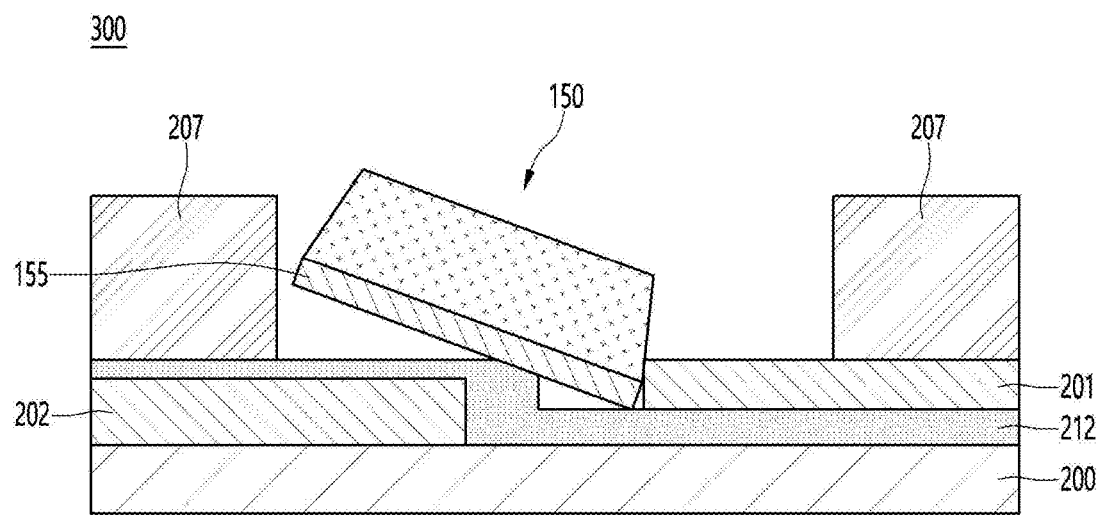
FIG. 8D is a view showing a tilt phenomenon that occurs when self-assembly to the internal technology.
Figure 8E:
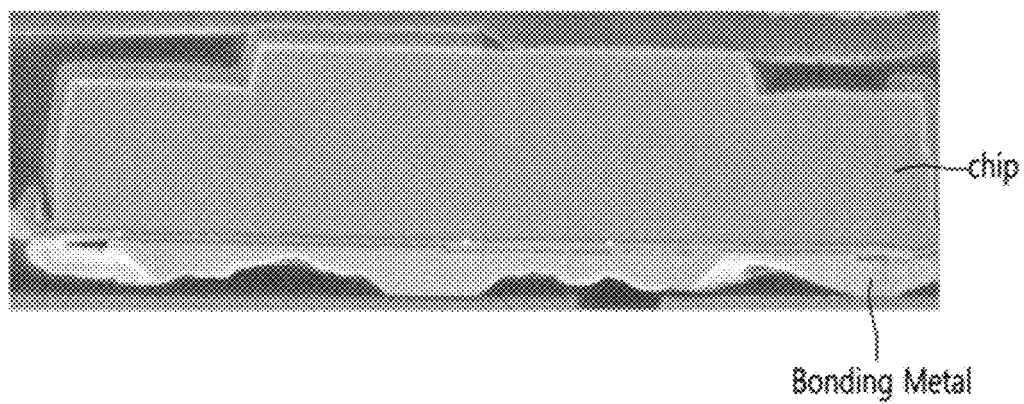
FIG. 8E is a FIB (focused ion beam) photograph of a light emitting device (chip) and a bonding metal in a display panel according to an internal technology.

Therefore, according to the unpublished internal technology, even-though DEP Force is required for self-assembly, there is a technical contradiction in that electrical contact characteristics are reduced due to the tilt phenomenon when using the DEP Force, Next, FIG. 8D is a diagram illustrating a tilt phenomenon that can occur during self-assembly according to an internal technology, and FIG. 8E is a picture of self-assembly in a display device according to an internal technology.

According to internal description, an insulating layer 212 is disposed on the first and second assembly electrodes 201 and 202 on the assembly substrate 200, self-assembly by the dielectrophoretic force of the semiconductor light emitting device 150 is performed in the assembly hole 220H set by the assembly and assembly barrier wall 207. However, according to internal technology, the electric field force is concentrated to the second assembly electrode 202, and as a result, there is a problem in that the assembly is biased in one direction, and thus the problem of self-assembly is not properly performed and the problem of tilt in the assembly hole 220H has been studied.

Figure 8F:
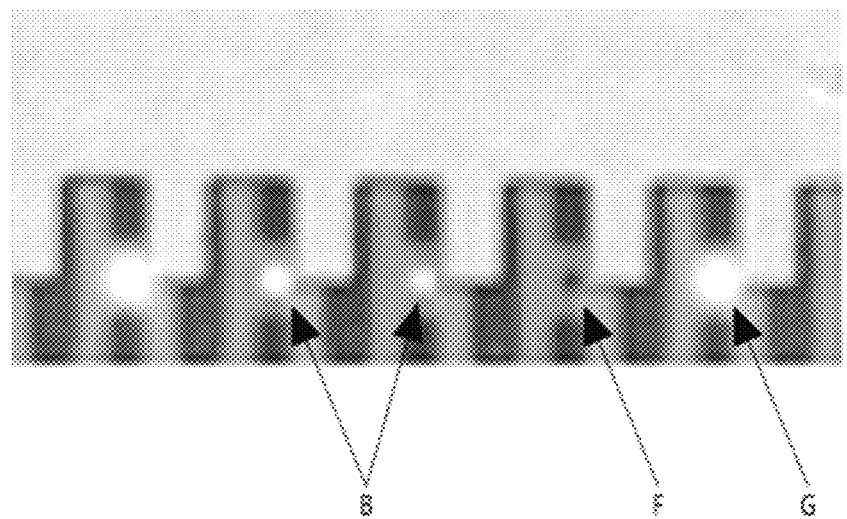
FIG. 8F is a photograph of the surface image of the bonding metal in the internal technique.

Further, FIG. 8E is a FIB (focused ion beam) photograph of a light emitting device (chip) and bonding metal in a display panel according to an internal technology, and FIG. 8F is lighting data in a display panel in an internal technology.

As shown in FIG. 8E, in the semiconductor light emitting device according to the internal technology, the surface morphology of the back bonding metal is not good, and the contact characteristics between the back bonding metal of the light emitting device and the panel wiring are not good, so lighting failure can occur.

In addition, according to the internal technology, the back bonding metal is in direct contact with the assembly electrode, but electrical contact failure occurs due to the non-uniformity of the surface of the bonding metal.

For example, FIG. 8F is lighting data in a display panel according to an internal technology.

According to internal technology, in the self-assembly method, weak lighting (B: Bad) or not lighting (F: Fail) can occur due to tilting due to non-uniformity of DEP force, or a defect in the surface characteristics of the rear bonding metal, and good lighting (G: Good) can be not achieved, and the lighting rate was studied at a level of 93.94%.

In the internal technology, for the electrode layer of the light emitting device, a material such as Ti, Cu, Pt, Ag, Au was used. When a bonding metal made of a material such as Sn or In is formed on the electrode layer made of such a material, the surface becomes uneven due to aggregation or the like.

On the other hand, in the internal technology, the deposition rate was increased to improve the surface properties of the bonding metal, but even if the agglomeration phenomenon was partially alleviated, another problem was found in that the grain size decreased as the deposition rate increased and the contact force decreased, so the problem of improving the surface properties of the bonding metal was not easy.

One of the technical objects of the embodiment is to solve the problem of low self-assembly rate due to non-uniformity of DEP force in the self-assembly method using dielectrophoresis (DEP).

Further, one of the technical objects of the embodiment is to solve the problem that the lighting rate is reduced due to the reduction of electrical contact characteristics between the electrodes of the self-assembled light emitting device and a predetermined panel electrode.

Further, one of the technical objects of the embodiment is to provide a display device including a semiconductor light emitting device that can secure a large-area bonding technology based on an ultra-small chip for realizing a microLED panel and can improve quality through assembly and bonding process optimization.

Next, FIGS. 9A to 9D are diagrams illustrating a manufacturing process of the display device 301 (Hereinafter, 'first embodiment' will be abbreviated as 'embodiment') including the semiconductor light emitting device according to the first embodiment.

Figure 9A:
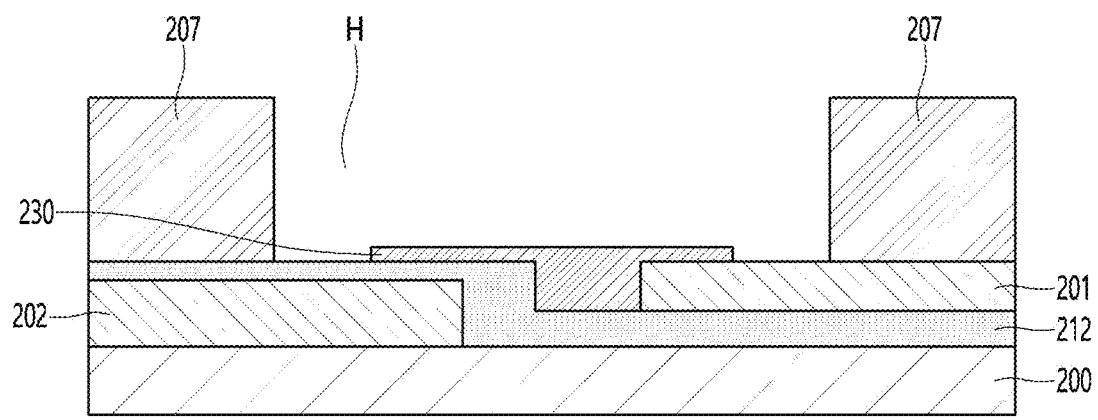
FIGS. 9A to 9D are views illustrating an assembly process of a display device 301 including a semiconductor light emitting device according to the first embodiment.
Figure 9B:
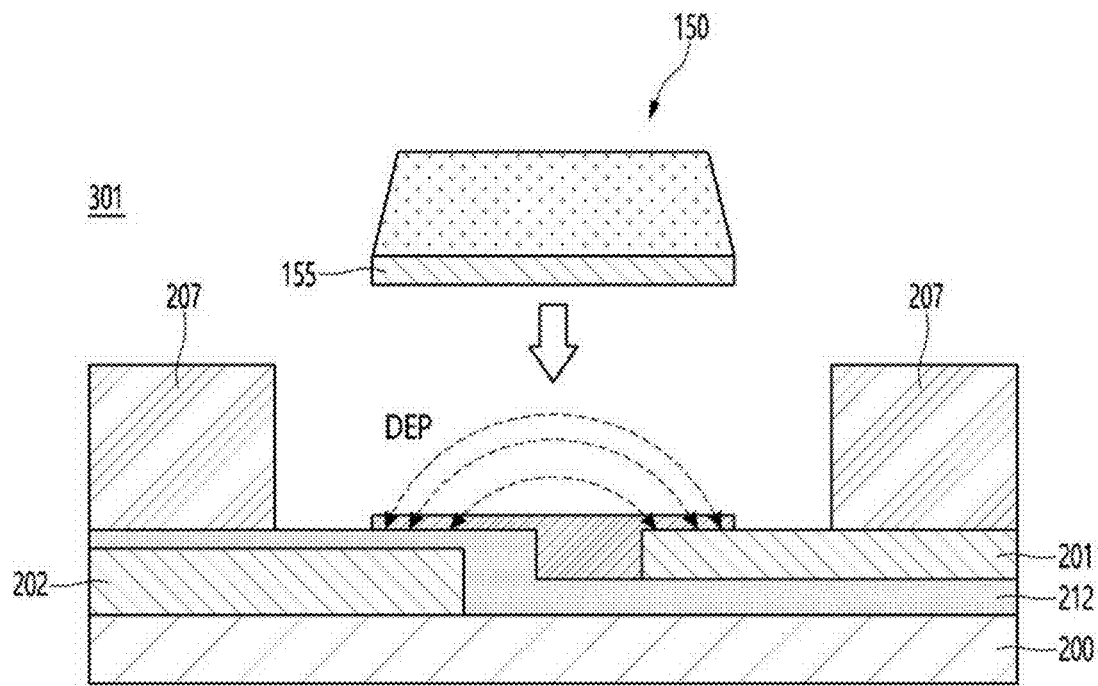
Figure 9C:
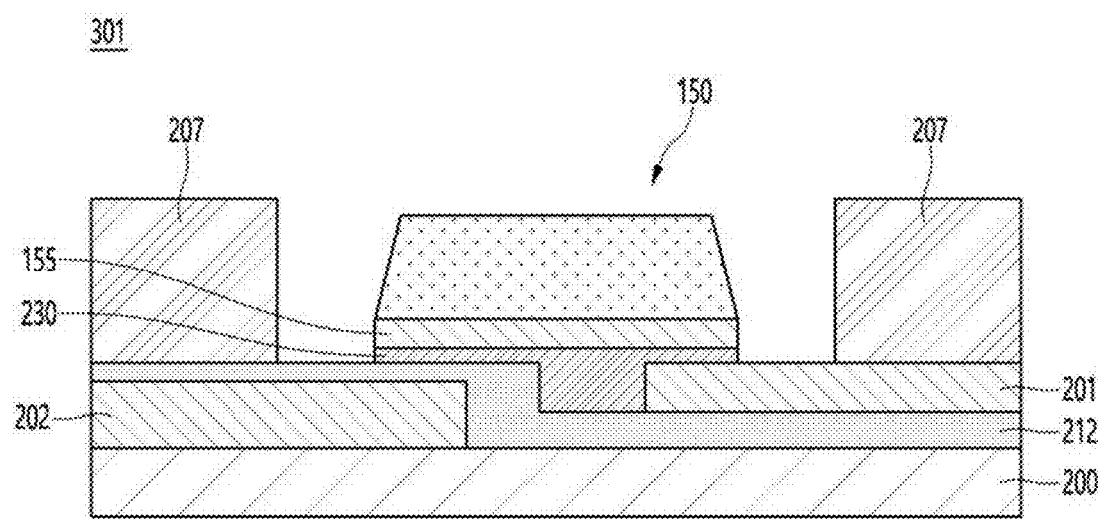
Figure 9D:
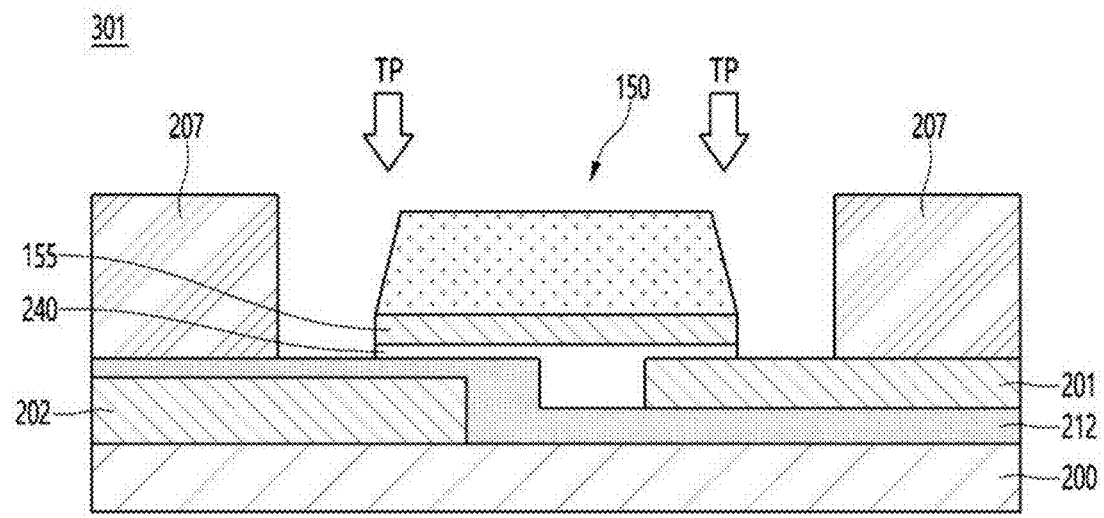

Referring to FIG. 9D, a display device 301 having a semiconductor light emitting device according to an embodiment can include a substrate 200, a first assembly electrode 201, a second assembly electrode 202 disposed to be spaced apart on the substrate 200, an insulating layer 212 disposed between the first assembly electrode 201 and the second assembly electrode 202, an assembly barrier wall 207 disposed on the first assembly electrode 201, the second assembly electrode 202, and the insulating layer 212 with assembly holes H, an annealed light-transmitting electrode layer 240 disposed on the insulating layer 212 and the first assembly electrode 201 in the assembly hole H and a semiconductor light emitting device 150 disposed in contact with the annealed light-transmitting electrode layer 240.

Hereinafter, the technical characteristics of the display device 301 including the semiconductor light emitting device according to the embodiment will be described with reference to FIGS. 9A to 9D.

Referring to FIG. 9A, in the first embodiment 301, a first assembly electrode 201, a second assembly electrode 202 that are spaced apart from each other on an assembly substrate 200, an insulating layer 212 disposed between the first assembly electrode 201 and the second assembly electrode 202 can be formed.

In this case, the insulating layer 212 can cover the second assembly electrode 202, but may not cover the first assembly electrode 201.

For example, the insulating layer 212 can be disposed above the second assembly electrode 202 and below the first assembly electrode 201.

Thereafter, the assembly barrier wall 207 having the assembly hole H can be formed on the first assembly electrode 201, the second assembly electrode 202 and the insulating layer 212.

Thereafter, a light-transmitting dielectric layer 230 can be disposed on the insulating layer 212 and the first assembly electrode 201 in the assembly hole H.

The horizontal width of the light-transmitting dielectric layer 230 can be equal to or greater than the horizontal width of the semiconductor light emitting device 150 to be assembled later.

For example, the light-transmitting dielectric layer 230 can be disposed on a portion of the insulating layer 212 and a portion of the first assembly electrode 201. The light-transmitting dielectric layer 230 can be a material that can be converted into the light-transmitting electrode 240 through annealing through thermal compression bonding (TP).

For example, the light-transmitting dielectric layer 230 can be any one of indium oxide, gallium oxide, aluminum oxide, or antimony oxide including at least one of Ti, Zn, Al, or Ga, but is not limited thereto.

In the embodiment, the light-transmitting dielectric layer 230 can be formed thinner than the assembly electrode. For example, the light-transmitting dielectric layer 230 can be formed to have a thickness of 100 nm or less. Further, the light-transmitting dielectric layer 230 can be formed to have a thickness of 80 nm or less. Further, the light-transmitting dielectric layer 230 can be formed to have a thickness of 60 nm or less.

In addition, the light-transmitting dielectric layer 230 can be formed to have a thickness of 2 nm or more. In addition, the light-transmitting dielectric layer 230 can be formed to have a thickness of 5 nm or more.

Thereafter, as shown in FIG. 9b, the semiconductor light emitting device 150 is injected in a predetermined fluid, and a DEP force can be generated between the first assembly electrode 201 and the second assembly electrode 202, the semiconductor light emitting device 150 can be assembled in an assembly hole as shown in FIG. 9C.

According to the embodiment, unlike the internal technology, as the light-transmitting dielectric layer 230 is disposed on the first assembly electrode 201 which is an assembly wiring, an electric field can be uniformly generated on the first assembly electrode 201 and the second assembly electrode 202, there is a special technical effect that the semiconductor light emitting device 150 can be assembled properly in the assembly hole.

Thereafter, the bonding metal 155 can be thermos-compress bonded through thermos-compression bonding (TP) as shown in FIG. 9D.

At this time, the light-transmitting dielectric layer 230 is annealed and converted into the light-transmitting electrode 240 to exhibit electrical conductivity.

For example, the light-transmitting dielectric layer 230 is converted into the light-transmitting electrode 240 by thermos-compression bonding at 300 to 350° C. or higher through Bonder equipment, so the resistance is remarkably less than about $3.0 \times 10-3$ ($\Omega$. cm), and the electrical conductivity can become higher.

In the embodiment, as the light-transmitting dielectric layer 230 is annealed, grain boundaries can be removed to increase conductivity.

According to the embodiment, unlike the internal technology, as the light-transmitting dielectric layer 230 is disposed on the first assembly electrode 201 which is an assembly wiring, the electric field is uniformly generated on the first assembly electrode 201 and the second assembly electrode 202, so there is a technical effect in that the conductor light emitting device 150 can be assembled properly in the assembly hole.

In addition, after the semiconductor light emitting device 150 is assembled, an annealing process and a bonding process are performed, and the light-transmitting dielectric layer 230 is changed into the light-transmitting electrode 240, so the resistance is significantly lowered and the conductivity is improved and the light-transmitting electrode 240 can function as a panel electrode.

In this case, as the entire area of the bonding metal 155 disposed on the lower side of the semiconductor light emitting device 150 and the light-transmitting electrode 240 come into contact, the bonding defect is fundamentally solved, and there is a special technical effect that can prevent lighting failure and improve yield.

In addition, according to the embodiment, by disposing the light-transmitting dielectric layer 230 between the bonding metal 155 of the semiconductor light emitting device and the lower assembly electrode to cover the surface morphology of the back bonding metal, the contact characteristics between the back metal of the light emitting device and the panel wiring is significantly improved, there is a technical effect to solve the lighting failure.

In the embodiment, the light-transmitting electrode layer 240 can be formed including at least one of ITO (indium tin oxide), IAZO (indium aluminum zinc oxide), IZO (indium zinc oxide), IZTO (indium zinc tin oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO) or IGZO (In—Ga ZnO), but is not limited to these materials.

In the embodiment, the light-transmitting electrode layer 240 can be formed thinner than the assembly electrode.

For example, the light-transmitting electrode layer 240 can be formed to have a thickness of 100 nm or less. In addition, the light-transmitting electrode layer 240 can be formed to have a thickness of 80 nm or less. In addition, the light-transmitting electrode layer 240 can be formed to have a thickness of 60 nm or less.

In addition, the light-transmitting electrode layer 240 can be formed to have a thickness of 2 nm or more. In addition, the light-transmitting electrode layer 240 can be formed to have a thickness of 5 nm or more.

Since the annealed light-transmitting electrode layer 240 according to the embodiment has a higher melting point than that of the bonding metal, there is a special technical effect of eliminating the reliability problem.

Conventionally, in the field of electronic devices using light emitting devices, ITO has been employed for the upper electrode layer of the light emitting device, but it was difficult to be employed as a material for the lower electrode layer due to the relatively low conductivity of ITO. In addition, there was a technical barrier to adopting ITO as a bonding metal material, which is subjected to a thermos-compression process, because the physical properties of ITO are brittle to impact.

On the other hand, according to the embodiment, as the thermos-compression bonding process proceeds to the light-transmitting dielectric layer 230, which is relatively strong in brittleness, shock is absorbed and annealing proceeds, there is a technical effect of improving the reliability of the light-transmitting electrode layer 240 while having excellent contact force with the bonding metal.

In addition, the embodiment is by $O_2$ plasma or Ar plasma treatment on the light-transmitting dielectric layer 230 before the thermos-compression process, there is a technical effect of improving the contact force with the bonding metal and improving the reliability of the annealed light-transmitting electrode layer 240.

In addition, since the surface of the light-transmitting dielectric layer 230 is made hydrophilic by $O_2$ plasma or Ar plasma treatment, the surface characteristics of the bonding metal thermos-compression-bonded on the light-transmitting dielectric 230 are remarkably improved, so there is a technical effect of uniformly forming without agglomeration.

Accordingly, according to the embodiment, in addition to the technical effect that the semiconductor light emitting device 150 can be assembled properly in the assembly hole, as the entire area of the bonding metal 155 disposed below the semiconductor light emitting device 150 and the light-transmitting electrode 240 come into contact, the bonding defect is fundamentally eliminated, thereby preventing lighting failure and improving yield.

Figure 9E:
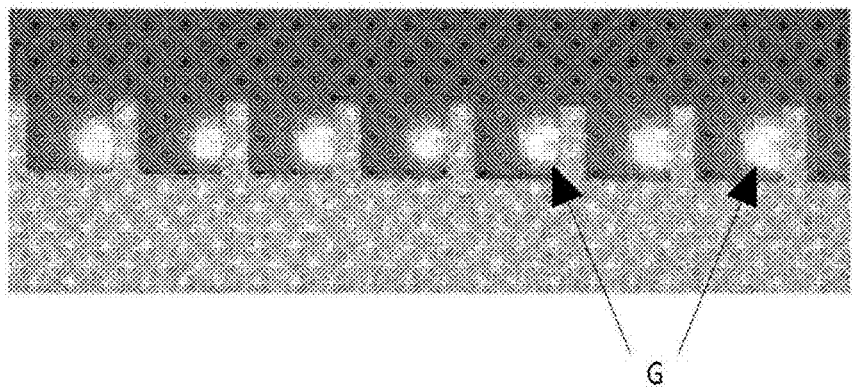
FIG. 9E is lighting data in the display panel according to the embodiment.

For example, FIG. 9E is lighting data in the display panel according to the embodiment. According to the embodiment, as the entire area of the bonding metal 155 disposed below the semiconductor light-emitting device 150 and the light-transmitting electrode 240 are in contact, and the contact characteristics between the bonding metal and the assembly electrode of the semiconductor light-emitting device are remarkably improved, there is a special technical effect of solving the problem of weak lighting or non-lighting by preventing lighting failure and achieving good lighting (G: Good).

Figure 10:
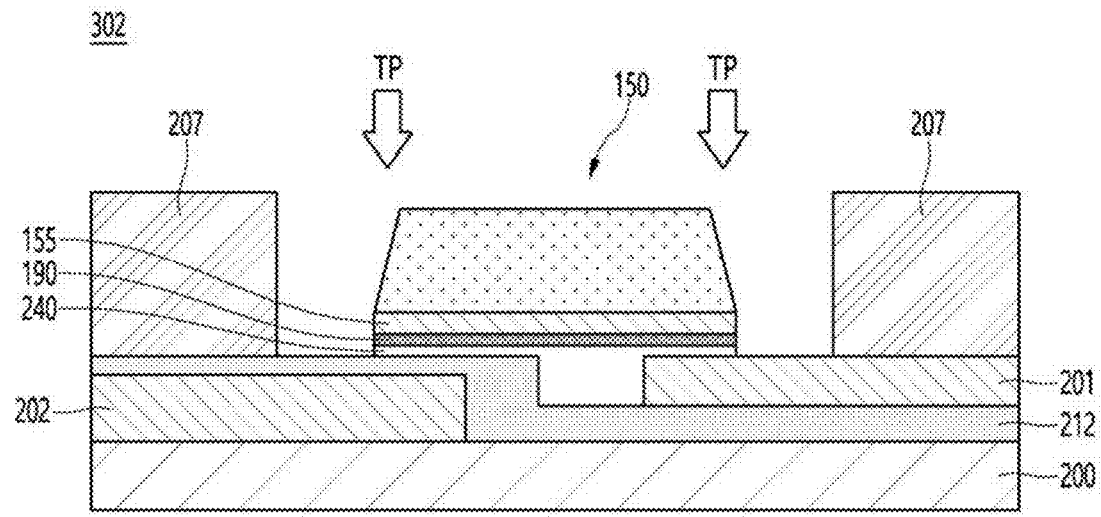
FIG. 10 is an exemplary view of a display device 302 including a semiconductor light emitting device according to a second embodiment.

Next, FIG. 10 is an exemplary view of a display device 302 including a semiconductor light emitting device according to a second embodiment.

The display device 302 according to the second embodiment can employ the technical features of the first embodiment, and the main features of the second embodiment will be mainly described below.

The display device 302 according to the second embodiment can further include a conductive bonding layer 190 disposed between the bonding metal 155 of the semiconductor light emitting device and the light-transmitting electrode layer 240.

For example, the conductive bonding layer 190 can include an intermetallic compound of the bonding metal 155 and the light-transmitting electrode layer 240.

According to the second embodiment, there is a technical effect of improving the electrical conductivity as well as improving the bonding force between the bonding metal 155 and the light-transmitting electrode layer 240 by the conductive bonding layer 190.

For example, as the conductive bonding layer 190 is formed to a thickness of 1.0 to 2.0 nm, it not only contributes to interfacial bonding force, but also has a special technical effect of improving electrical conductivity by the tunneling effect.

Figure 11:
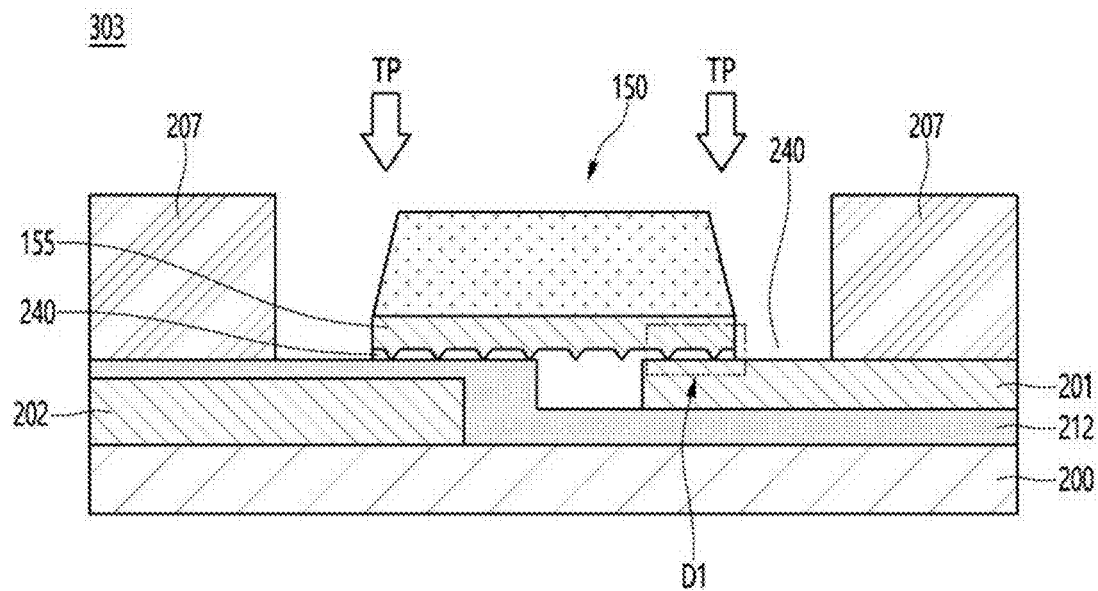
FIG. 11 is an exemplary view of a display device 303 including a semiconductor light emitting device according to a third embodiment.
Figure 12:
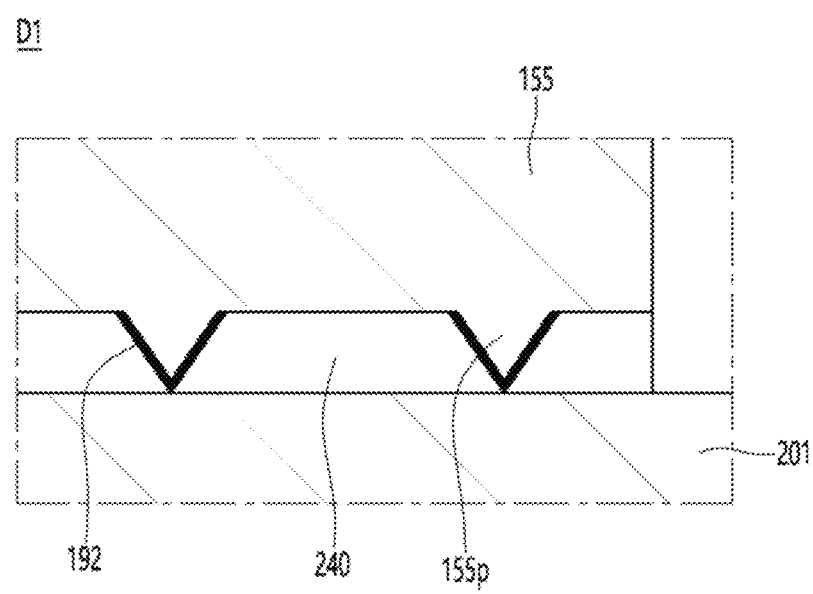
FIG. 12 is a partially enlarged view of a display device 303 having a semiconductor light emitting device according to the third embodiment shown in FIG. 11.

Next, FIG. 11 is an exemplary view of a display device 303 including a semiconductor light emitting device according to a third embodiment, and FIG. 12 is a partially enlarged view of FIG. 11.

The display device 303 according to the third embodiment can adopt the technical features of the first and second embodiments, and the main features of the third embodiment will be mainly described below.

In the third embodiment, the bonding metal 155 can further include a protruding bonding portion 192. A second conductive bonding layer 190 can be disposed between the protruding bonding portion 192 and the light-transmitting electrode layer 240.

As the bonding metal 155 of the third embodiment can include the protruding bonding portion 192, a second conductive bonding layer 190 which is an intermetallic compound between the material 155p of the bonding metal 155 and the light-transmitting electrode layer 240, can be formed in the protruding bonding portion 192 to which a relatively higher thermos-compression bonding is applied Accordingly, according to the third embodiment, not only the bonding strength between the bonding metal 155 and the light-transmitting electrode layer 240 is improved by the second conductive bonding layer 192, but also the electrical conductivity is improved. In addition, since the contact area between the light-transmitting electrode 240 and the bonding metal 155 is secured, there is a complex technical effect of excellent conductivity.

The above detailed description should not be construed as restrictive in all respects and should be considered as exemplary. The scope of the embodiments should be determined by a reasonable interpretation of the appended claims, and all modifications within the equivalent scope of the embodiments are included in the scope of the embodiments.

INDUSTRIAL APPLICABILITY

The embodiment can be employed in the field of display for displaying images or information.

The embodiment can be employed in the field of display for displaying images or information using a semiconductor light emitting device.

The embodiment can be employed in the field of display for displaying images or information using micro- or nano-level semiconductor light emitting devices.

What is claimed is:

1. A display device comprising:
   a first assembly electrode and a second assembly electrode spaced apart and disposed on a substrate;
   an insulating layer disposed between the first assembly electrode and the second assembly electrode;
   an assembly barrier wall having an assembly hole disposed on the first assembly electrode, the second assembly electrode, and the insulating layer;
   an annealed light-transmitting electrode layer disposed on the insulating layer in the assembly hole and on the first assembly electrode; and
   a semiconductor light emitting device disposed in contact with the annealed light-transmitting electrode layer.

2. The display device according to claim 1, wherein a horizontal width of the annealed light-transmitting electrode layer is equal to or greater than that of the semiconductor light emitting device, and is less than that of the assembly hole.

3. The display device according to claim 2, wherein a surface of the annealed light-transmitting electrode layer is hydrophilic.

4. The display device according to claim 1, further comprising a conductive bonding layer disposed between a bonding metal of the semiconductor light emitting device and the annealed light-transmitting electrode layer.

5. The display device according to claim 4, wherein the conductive bonding layer comprises an intermetallic compound of the bonding metal and the annealed light-transmitting electrode layer.

6. The display device according to claim 5, wherein a thickness of the conductive bonding layer is in a range of approximately 1.0 nm~2.0 nm.

7. The display device according to claim 4, wherein the bonding metal comprises a protruding bonding portion extending away from the bonding metal.

8. The display device according to claim 7, wherein the conductive bonding layer is disposed between the protruding bonding portion and the annealed light-transmitting electrode layer.

9. The display device according to claim 4, wherein a horizontal width of the annealed light-transmitting electrode layer is equal to or greater than that of the semiconductor light emitting device, and is less than a horizontal width of the assembly hole.

10. The display device according to claim 9, wherein a surface of the annealed light-transmitting electrode layer is hydrophilic.

11. A display device comprising:
    a first assembly electrode and a second assembly electrode spaced apart and disposed on a substrate;
    an insulating layer disposed between the first assembly electrode and the second assembly electrode;
    an annealed light-transmitting electrode layer disposed on the insulating layer and the first assembly electrode; and
    a semiconductor light emitting device disposed in contact with the annealed light-transmitting electrode layer.

12. The display device according to claim 11, wherein a horizontal width of the annealed light-transmitting electrode layer is equal to or greater than that of the semiconductor light emitting device, and is less than that of the assembly hole.

13. The display device according to claim 12, wherein a surface of the annealed light-transmitting electrode layer is hydrophilic.

14. The display device according to claim 11, further comprising a conductive bonding layer disposed between a bonding metal of the semiconductor light emitting device and the annealed light-transmitting electrode layer.

15. The display device according to claim 14, wherein the conductive bonding layer comprises an intermetallic compound of the bonding metal and the annealed light-transmitting electrode layer.

16. The display device according to claim 15, wherein a thickness of the conductive bonding layer is in the range of approximately 1.0 nm~2.0 nm.

17. The display device according to claim 14, wherein the bonding metal comprises a protruding bonding portion extending away from the bonding metal.

18. The display device according to claim 17, wherein the conductive bonding layer is disposed between the protruding bonding portion and the annealed light-transmitting electrode layer.

19. The display device according to claim 14, wherein a horizontal width of the annealed light-transmitting electrode layer is equal to or greater than that of the semiconductor light emitting device, and is less than a horizontal width of the assembly hole.

20. The display device according to claim 19, wherein a surface of the annealed light-transmitting electrode layer is hydrophilic.

* * * * *